United States Patent
Gong et al.

(10) Patent No.: US 11,114,514 B2
(45) Date of Patent: Sep. 7, 2021

(54) ORGANIC ELECTROLUMINESCENT DISPLAY PANEL, MANUFACTURING METHOD THEREOF, AND DISPLAY DEVICE

(71) Applicants: Hefei BOE Optoelectronics Technology Co., Ltd., Hefei (CN); BOE TECHNOLOGY GROUP CO., LTD., Beijing (CN)

(72) Inventors: Kui Gong, Beijing (CN); Xianxue Duan, Beijing (CN); Zhihai Zhang, Beijing (CN)

(73) Assignees: HEFEI BOE OPTOELECTRONICS TECHNOLOGY CO., LTD., Hefei (CN); BOE TECHNOLOGY GROUP CO., LTD., Beijing (CN)

(*) Notice: Subject to any disclaimer, the term of this patent is extended or adjusted under 35 U.S.C. 154(b) by 53 days.

(21) Appl. No.: 16/608,919

(22) PCT Filed: Mar. 12, 2019

(86) PCT No.: PCT/CN2019/077837
§ 371 (c)(1),
(2) Date: Oct. 28, 2019

(87) PCT Pub. No.: WO2019/196587
PCT Pub. Date: Oct. 17, 2019

(65) Prior Publication Data
US 2021/0118964 A1    Apr. 22, 2021

(30) Foreign Application Priority Data
Apr. 11, 2018 (CN) .......................... 201810319552.7

(51) Int. Cl.
*H01L 27/32* (2006.01)
*H01L 51/00* (2006.01)
*H01L 51/56* (2006.01)

(52) U.S. Cl.
CPC ...... *H01L 27/3246* (2013.01); *H01L 51/0005* (2013.01); *H01L 51/56* (2013.01)

(58) Field of Classification Search
None
See application file for complete search history.

(56) References Cited

U.S. PATENT DOCUMENTS 9,991,322 B2    6/2018   Liu et al.
2013/0083569 A1    4/2013   Minoura et al.
(Continued)

FOREIGN PATENT DOCUMENTS

CN    103035522    4/2013
CN    103839965    6/2014
(Continued)

OTHER PUBLICATIONS

Adv Mater_2011_abstract (Year: 2011).*
(Continued)

*Primary Examiner* — Bo B Jang
(74) *Attorney, Agent, or Firm* — Thomas | Horstemeyer, LLP

(57) ABSTRACT

An organic electroluminescent display panel is provided, including a pixel defining layer. The pixel defining layer includes a plurality of openings and a bank surrounding each of the plurality of openings and defining a plurality of pixel areas. The bank is composed of a hydrophilic material pattern layer and a conductive hydrophobic pattern layer which are stacked from bottom to top.

11 Claims, 4 Drawing Sheets

(56) References Cited

U.S. PATENT DOCUMENTS

2017/0077194 A1    3/2017   Liu et al.
2018/0233549 A1    8/2018   Liu et al.

FOREIGN PATENT DOCUMENTS

| | | |
|---|---|---|
| CN | 104952905 | 9/2015 |
| CN | 108470756 | 8/2018 |
| EP | 2575177 A2 | 4/2013 |
| EP | 2575177 A3 | 8/2014 |
| JP | 2009070708 | 4/2009 |
| WO | WO2016176956 A1 * | 11/2016 |

OTHER PUBLICATIONS

English translate_JP2009070708A (Year: 2009).*
English translate_WO2016176956A1 (Year: 2016).*
International Search Report and Written Opinion dated Jun. 18, 2019 for PCT Patent Application No. PCT/CN2019/077837.
1st Office Action dated Jul. 5, 2019 for Chinese Patent Application No. 201810319552.7.
2nd Office Action dated Aug. 30, 2019 for Chinese Patent Application No. 201810319552.7.

* cited by examiner

ORGANIC ELECTROLUMINESCENT DISPLAY PANEL, MANUFACTURING METHOD THEREOF, AND DISPLAY DEVICE

CROSS REFERENCE TO RELATED APPLICATIONS

The present application is a § 371 national phase application of PCT/CN2019/077837 filed Mar. 12, 2019, which claims the benefit of and priority to Chinese Patent Application No. 201810319552.7, filed on Apr. 11, 2018, the contents of which being hereby incorporated by reference in their entireties herein.

TECHNICAL FIELD

The present disclosure relates to the field of display technologies and, in particular, relates to an organic electroluminescent display panel, a manufacturing method thereof, and a display device.

BACKGROUND

Utilizing inkjet printing to fabricate OLED (Organic Light Emitting Diode) and QLED (Quantum Dot Light Emitting Diode) displays is an important direction for the development of display technology in the future due to its low cost, high throughput, and easy realization of large size. Inkjet printing technology is considered to be the most effective way to achieve low cost and large area full color display of OLED and QLED.

In a conventional printed AM-QLED (Active Matrix Quantum Dot Light Emitting Diode) or AMOLED (Active Matrix Organic Light Emitting Diode) device, in order to prevent the display ink from overflowing to the periphery during printing, a pixel defining layer bank is configured to be a structure that is narrower in the upper portion, wider in the lower portion, and with a flat top. As shown in FIG. 1, a pixel defining layer bank 5' disposed above a substrate 1', a TFT array structure 2', a planarization layer 3' and an OLED anode 4' is configured to be a structure that is narrower in the upper portion, wider in the lower portion, and with a flat top. In this configuration, when the ink trajectory shifts during printing or when a comet point is ejected, the ink droplets dripping on the top of the pixel defining layer bank 5' remains on the top of the bank 5', thus reducing the amount of ink in the opening area of the pixel defining layer, thereby resulting in non-uniform film thicknesses of light emitting element functional layers in the pixel areas after drying.

SUMMARY

The present disclosure provides an organic electroluminescent display panel, a manufacturing method thereof, and a display device.

One aspect of the present disclosure provides an organic electroluminescent display panel, including a pixel defining layer disposed on a substrate, the pixel defining layer including a plurality of openings and a bank surrounding each opening and defining a plurality of pixel areas, wherein the bank is composed of a hydrophilic material pattern layer and a conductive hydrophobic pattern layer which are stacked from bottom to top over the substrate.

According to one embodiment of the present disclosure, a material of the hydrophilic material pattern layer includes silicon dioxide.

According to one embodiment of the present disclosure, a material of the conductive hydrophobic pattern layer includes a hydrophobic resin, a photosensitizer, and a conductive material.

According to one embodiment of the present disclosure, the conductive material includes at least one of carbon nanotubes, graphene, and nano silver wires, and the mass percentage content of the conductive material is 5%-20% of the conductive hydrophobic pattern layer by mass.

According to one embodiment of the present disclosure, the conductive hydrophobic pattern layer is subjected to a hydrophobic treatment.

According to one embodiment of the present disclosure, a height of the hydrophilic material pattern layer is ½ to ⅔ of a height of the bank.

According to one embodiment of the present disclosure, an opening area of the pixel defining layer is provided with an organic electroluminescent device (OLED) functional layer, and an OLED cathode layer is disposed over the OLED functional layer and the pixel defining layer bank.

Another aspect of the present disclosure also provides a manufacturing method of an organic electroluminescent display panel, including steps of: providing an OLED array substrate; forming a hydrophilic material layer on the OLED array substrate; forming a conductive hydrophobic layer on the hydrophilic material layer; patterning the conductive hydrophobic layer to form a conductive hydrophobic pattern layer; and taking fluorine-based gas as a working gas, taking the conductive hydrophobic pattern layer as an anti-etching layer, and plasma-etching the hydrophilic material layer to form a hydrophilic material pattern layer; wherein the hydrophilic material pattern layer and the conductive hydrophobic pattern layer form a pixel defining layer including a plurality of openings and a plurality of banks.

According to one embodiment of the present disclosure, the hydrophilic material layer includes silicon dioxide.

According to one embodiment of the present disclosure, the conductive hydrophobic pattern includes a hydrophobic resin, a photosensitizer, and a conductive material.

According to one embodiment of the present disclosure, the conductive material includes at least one of carbon nanotubes, graphene, and nano silver wires, and the mass percentage content of the conductive material is 5%-20% of the conductive hydrophobic layer by mass.

According to one embodiment of the present disclosure, the method further includes a step of performing a hydrophobic treatment on the conductive hydrophobic pattern layer.

According to one embodiment of the present disclosure, the method further includes steps of: inkjet printing in the opening area to form an OLED functional layer; and forming an OLED cathode layer on the OLED functional layer and the bank.

A third aspect of the present disclosure also provides a display device including the above display panel.

BRIEF DESCRIPTION OF THE DRAWINGS

The above and other features and advantages of the present disclosure will become more apparent from the detailed description of the exemplary embodiments.

DETAILED DESCRIPTION

Figure 1:
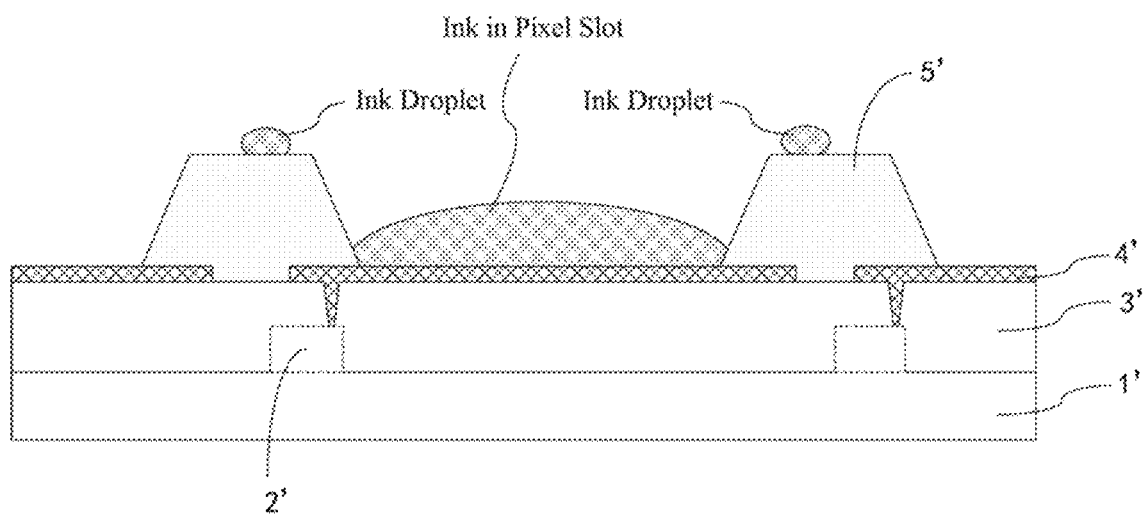
FIG. 1 is a schematic structural diagram of a conventional organic light emitting display panel.

The specific embodiments of the organic electroluminescent display panel, the manufacturing method thereof, and the display device provided by the embodiments of the present disclosure are described in detail below with reference to the accompanying drawings.

The thickness and shape of each film layer in the drawings do not reflect the true proportion of the organic electroluminescent display panel, and they only serve the purpose of illustrating the present disclosure.

Embodiments of the present disclosure provide an organic electroluminescent display panel and a manufacturing method thereof.

With reference to the drawings, the reference numerals are as follows:
1: Substrate;
2: TFT array structure layer;
3: Planarization layer;
4: OLED anode layer;
5: Silicon dioxide layer;
51: Silicon dioxide pattern layer;
6: Conductive hydrophobic layer;
61: Conductive hydrophobic pattern layer;
62: Conductive hydrophobic pattern layer having superhydrophobicity;
7: OLED functional layer;
8: OLED cathode layer;
1': Substrate;
2': TFT array structure layer;
3': Planarization layer;
4': OLED anode layer; and
5': Pixel defining layer.

Figure 2:
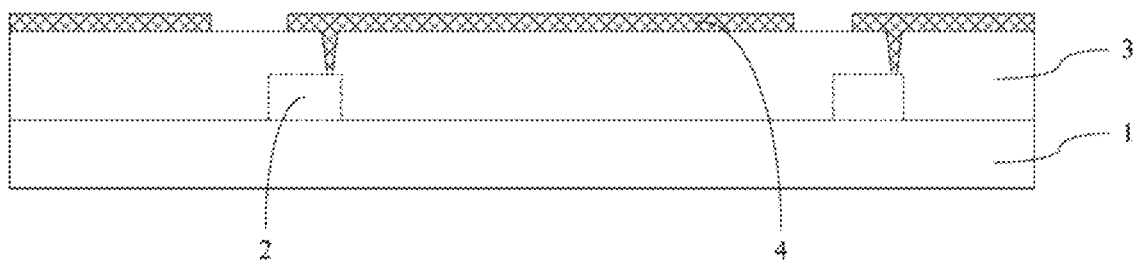
FIGS. 2 to 8 are flowcharts showing a process of fabricating an organic light emitting display panel according to an embodiment of the present disclosure.

As shown in FIG. 2, an OLED array substrate is provided, including a substrate 1, a TFT array structure layer 2, a planarization layer 3, an OLED anode layer 4, etc. For a top emission type OLED, the OLED anode layer 4 may further include an ITO layer of a high work function in the top portion and a reflective metal layer in the lower portion. Part of the structure is omitted from the figure.

Figure 3:
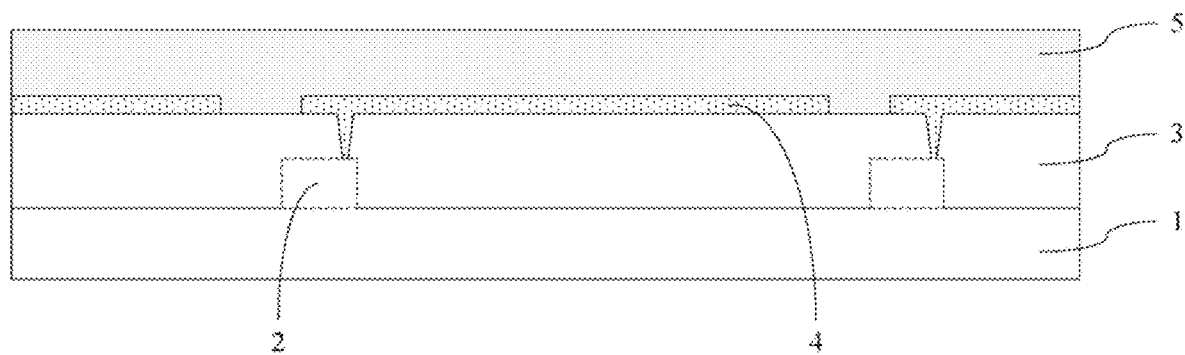

As shown in FIG. 3, a silicon dioxide layer 5 is deposited and grown on the upper surface of the OLED array substrate by plasma enhanced vapor deposition (PECVD). In the present embodiment, silica is used as the hydrophilic material, but the hydrophilic material of the present disclosure is not limited to silica, and may be any hydrophilic material suitable for a pixel defining layer.

Figure 4:
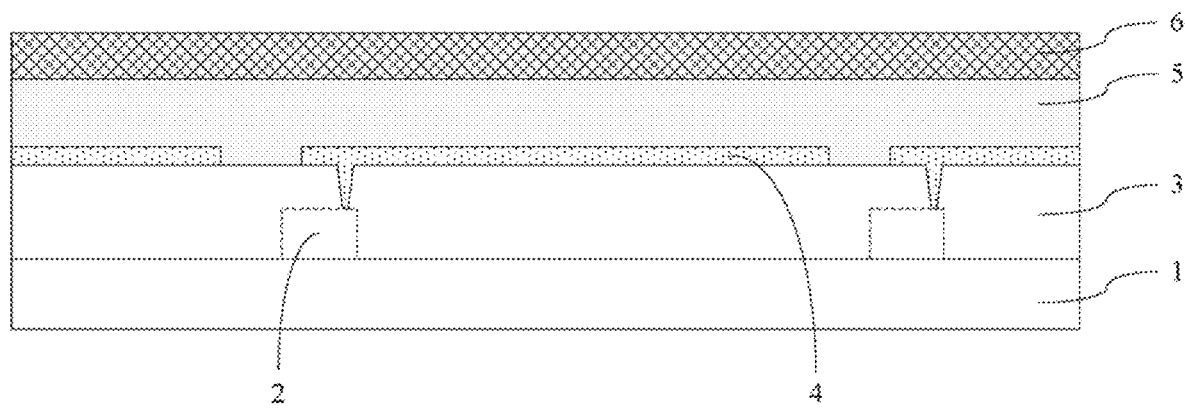

A transparent conductive hydrophobic layer 6 is formed on the upper surface of the silicon dioxide layer 5 by coating, as shown in FIG. 4. The transparent conductive hydrophobic layer 6 is composed of a conductive material, a hydrophobic resin, a photosensitizer, and the like. The conductive material can provide good conductivity, and the hydrophobic resin provides hydrophobicity. The conductive material may be at least one of carbon nanotubes, graphene, nano silver wires, and the like. The conductive material may alternatively be carbon nanotubes. The mass percentage content of the carbon nanotubes in the conductive hydrophobic layer 6 may be 5%-20%. The hydrophobic resin may be any hydrophobic resin suitable for an OLED device, and those skilled in the art may select a suitable hydrophobic resin as desired. The transparent conductive hydrophobic film has a thickness of about 100 to 1000 nm. After adding photosensitizer, the hydrophobic resin is a photosensitive resin (or photoresist) which is developed by exposure to form a pattern.

Figure 5:
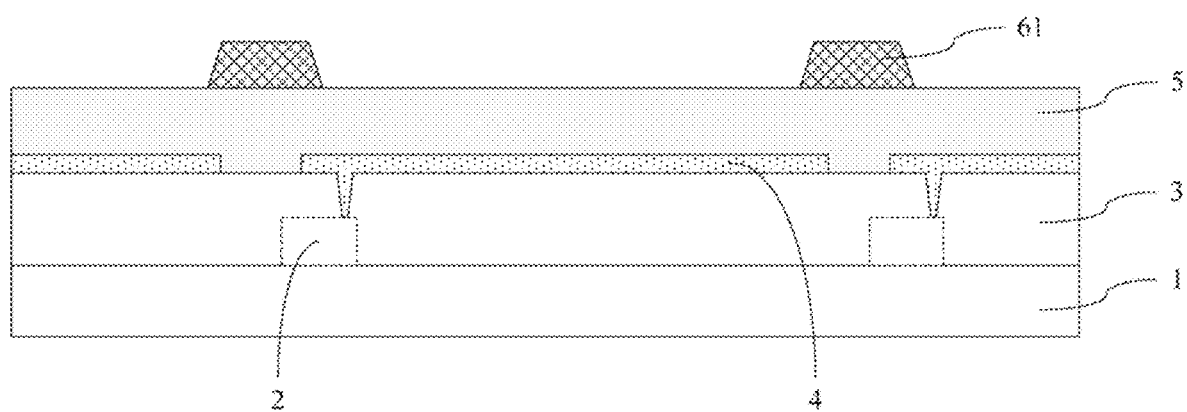

The photosensitive portion of the transparent conductive hydrophobic layer 6 is removed by development processing through exposure development technology, thereby producing a transparent conductive hydrophobic pattern layer 61 as shown in FIG. 5.

Figure 6:
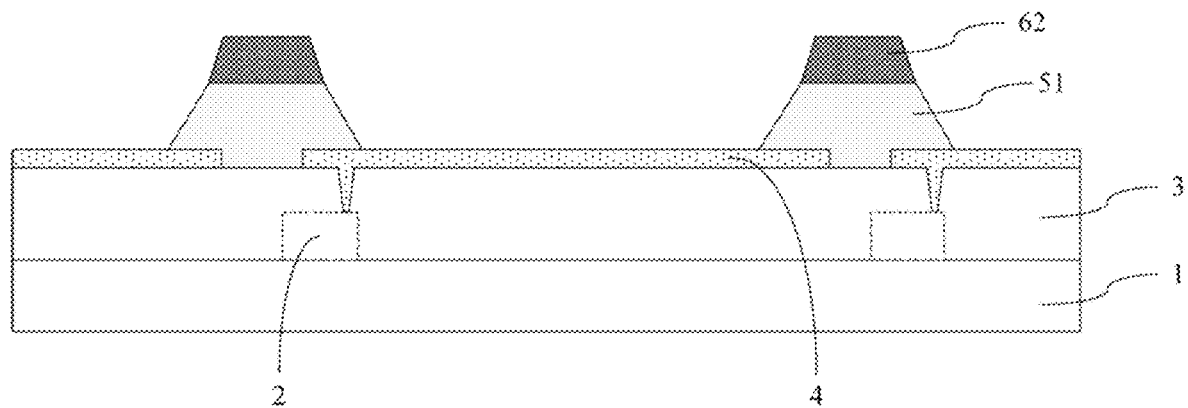

Taking a fluorine-based gas as a working gas (such as CF4) and the transparent conductive hydrophobic pattern layer 61 as an anti-etching layer, the exposed silicon dioxide layer 5 is etched by a plasma etching apparatus to form a silicon dioxide pattern layer 51. The fluorine-based plasma fluorinates the upper surface of the transparent conductive hydrophobic pattern layer 61 to make it hydrophobic while etching the silicon dioxide layer 5, thereby enhancing the hydrophobic property of the upper surface of the transparent conductive hydrophobic pattern layer 61 and making it superhydrophobic. In addition, the hit of plasma forms a micro nano structure on the surface thereof, thereby further enhancing the superhydrophobic property of the upper surface of the transparent conductive hydrophobic pattern layer 61. After the fluorination etching, the conductive hydrophobic pattern layer 61 becomes a conductive hydrophobic pattern layer having superhydrophobicity 62. After the etching is completed, the structure is as shown in FIG. 6, the upper half of the pixel defining layer bank is the conductive hydrophobic pattern layer having superhydrophobicity 62 on the upper surface, together with the lower hydrophilic silicon dioxide pattern layer 51, forms the pixel defining layer bank of the OLED device. In inkjet printing, when the ink droplets drips on the top of the transparent conductive hydrophobic layer having superhydrophobicity 62 of the bank of the pixel defining layer, under the action of gravity, the ink droplets will slide down to the opening area surrounded by the hydrophilic silicon dioxide pattern layer 51 in the lower portion, thereby preventing the ink trajectory from shifting or the ink droplets generating a comet point, and the problem of non-uniform film thicknesses when fabricating the OLED by the inkjet printing process can be solved. In the present disclosure, since the silicon dioxide pattern layer 51 has hydrophilicity, it can attract ink droplets during inkjet printing, thus it can prevent ink trajectories from shifting or generating comet points. In order to achieve better effect, the height of the silicon dioxide pattern layer 51 may be ½-⅔ of the height of the bank.

Figure 7:
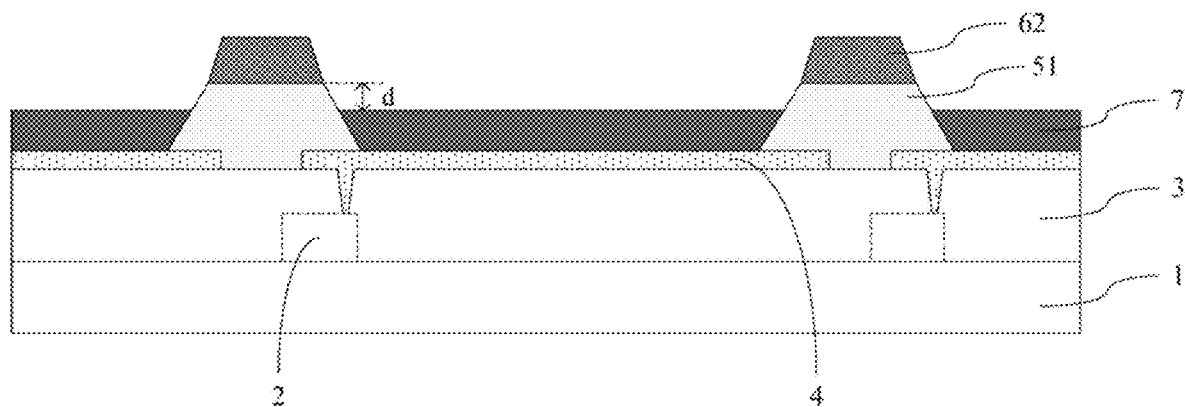

After the pixel defining layer is formed, the OLED organic functional layer 7 is printed by inkjet printing. The OLED organic functional layer 7 is generally composed of one or more layers of a hole injection layer, a hole transport layer, a light emitting layer, a hole blocking layer, an electron blocking layer, an electron transport layer, an electron injection layer, and the like. In order to prevent the OLED film layer from being short-circuited, the top of the OLED organic functional layer 7 has a certain distance d from the bottom of the transparent conductive hydrophobic pattern layer having superhydrophobicity 62, as shown in FIG. 7. The distance d is to prevent the OLED film layer from being short-circuited, and a person skilled in the art can select a suitable distance according to a specific structure, details of which will not be described herein.

Figure 8:
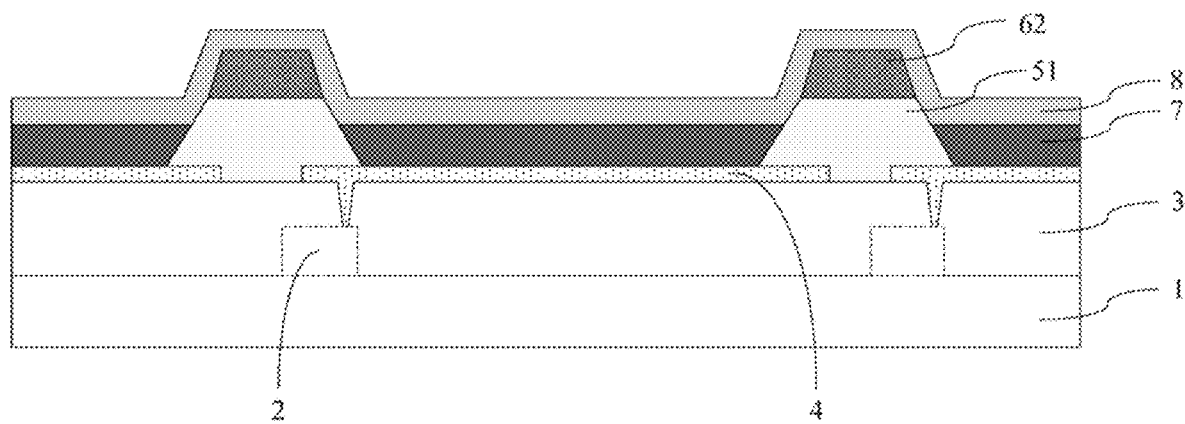

Finally, the OLED cathode layer 8 is further formed by evaporation or magnetron sputtering. For the top emission type OLED, the cathode layer 8 on the top of the OLED may be a layer formed by metal having a small work function (such as Li, Ca, LiF/Ca, LiF/Al, Al, Ag, Mg, or a combination thereof) and a transparent conductive layer formed of ITO, IZO, ZnO, or $In_2O_3$, as shown in FIG. 8. The transparent conductive hydrophobic pattern layer having superhydrophobicity 62 on the upper surface of the pixel defining layer bank is integrated with the cathode 8 at the top of the OLED, which can reduce the voltage drop of the cathode film layer, thereby improving the brightness uniformity of the OLED light emitting device.

Optionally, an embodiment of the present disclosure further provides a display device, which may include the above OLED display panel, and the display device may be: a liquid crystal panel, an electronic paper, a mobile phone, a tablet computer, a television, a display, a notebook computer, a digital photo frame, a navigation device, and any product or component that has a display function.

In view of the above, in the display substrate provided by the embodiment of the present disclosure, by stacking a hydrophilic silicon dioxide pattern layer at the lower portion of the pixel defining layer and a conductive hydrophobic pattern layer at the upper portion of the pixel defining layer, during ink-jet printing, under repulsion action of the upper surface of the hydrophilic silicon dioxide pattern layer to the ink droplets and the attraction action of the silica pattern layer to the ink droplets, it can control the ink droplets dripping on the upper surface of the bank, and prevent the ink trajectory from shifting or generating a comet point, thereby reducing the defect of uneven film formation in the pixel area. Furthermore, the conductive hydrophobic pattern layer on the upper portion of the bank is integrated with the cathode layer of the OLED, which can reduce the voltage drop of the cathode film layer, thereby improving the brightness uniformity of the OLED light emitting device.

Of course, the present disclosure may have various other embodiments, and various corresponding changes and modifications may be made by those skilled in the art without departing from the spirit and scope of the disclosure. Such changes and modifications are intended to be included within the scope of the appended claims of the present disclosure.

What is claimed is:

1. An organic electroluminescent display panel, comprising:
    a pixel defining layer disposed on a substrate, the pixel defining layer comprising a plurality of openings and a bank surrounding each of the openings and defining a plurality of pixel areas, wherein:
    the bank is composed of a hydrophilic material pattern layer and a conductive hydrophobic pattern layer which are stacked from bottom to top over the substrate;
    the conductive hydrophobic pattern layer comprises a hydrophobic resin, a photosensitizer, and a conductive material,
    the conductive material comprises at least one of carbon nanotubes and graphene, and the mass percentage content of the conductive material is 5% to 20% of the conductive hydrophobic pattern layer by mass.

2. The organic electroluminescent display panel according to claim 1, wherein the hydrophilic material pattern layer comprises silicon dioxide.

3. The organic electroluminescent display panel according to claim 1, wherein a height of the hydrophilic material pattern layer is ½ to ⅔ of a height of the bank.

4. The organic electroluminescent display panel according to claim 1, wherein an opening area of the pixel defining layer is provided with an organic electroluminescent device functional layer, and an organic electroluminescent device cathode layer is disposed over the organic electroluminescent device functional layer and the bank of the pixel defining layer.

5. A manufacturing method of an organic electroluminescent display panel, comprising:
    providing an organic light-emitting diode (OLED) array substrate;
    forming a hydrophilic material layer on the OLED array substrate;
    forming a conductive hydrophobic layer on the hydrophilic material layer;
    patterning the conductive hydrophobic layer to form a conductive hydrophobic pattern layer; and
    taking fluorine-based gas as a working gas and the conductive hydrophobic pattern layer as an anti-etching layer, plasma-etching the hydrophilic material layer to form a hydrophilic material pattern layer and a conductive hydrophobic pattern layer having superhydrophobicity, wherein:
    the hydrophilic material pattern layer and the conductive hydrophobic pattern layer having superhydrophobicity form a pixel defining layer comprising a plurality of openings and a plurality of banks;
    the conductive hydrophobic pattern layer comprises a hydrophobic resin, a photosensitizer, and a conductive material;
    the conductive material comprises at least one of carbon nanotubes and graphene, and the mass percentage content of the conductive material is 5% to 20% of the conductive hydrophobic layer by mass.

6. The manufacturing method according to claim 5, wherein the hydrophilic material layer comprises silicon dioxide.

7. The manufacturing method according to claim 5, further comprising:
    inkjet printing to form an OLED functional layer; and
    forming an OLED cathode layer on the OLED functional layer.

8. A display device comprising an organic electroluminescent display panel, the organic electroluminescent display panel comprising:
    a pixel defining layer disposed on a substrate, the pixel defining layer comprising a plurality of openings and a bank surrounding each opening and defining a plurality of pixel areas, wherein:
    the bank is composed of a hydrophilic material pattern layer and a conductive hydrophobic pattern layer which are stacked from bottom to top over the substrate;
    the conductive hydrophobic pattern layer comprises a hydrophobic resin, a photosensitizer, and a conductive material; and
    the conductive material comprises at least one of carbon nanotubes and graphene, and the mass percentage content of the conductive material is 5% to 20% of the conductive hydrophobic pattern layer by mass.

9. The display device according to claim 8, wherein the hydrophilic material pattern layer comprises silicon dioxide.

10. The display device according to claim 8, wherein a height of the hydrophilic material pattern layer is ½ to ⅔ of a height of the bank.

11. The display device according to claim 8, wherein an opening area of the pixel defining layer is provided with an organic electroluminescent device functional layer, and an organic electroluminescent device cathode layer is disposed over the organic electroluminescent device functional layer and the bank of the pixel defining layer.

* * * * *